(12) United States Patent
Kashitani et al.

(10) Patent No.: US 8,766,313 B2
(45) Date of Patent: Jul. 1, 2014

(54) MOUNTING BOARD AND STRUCTURE OF THE SAME

(75) Inventors: Kohsuke Kashitani, Fujiyoshida (JP); Koichi Fukasawa, Fujiyoshida (JP); Jun Takashima, Kadoma (JP); Katsuyuki Kiyozumi, Kadoma (JP)

(73) Assignees: Citizen Electronics Co., Ltd., Yamanashi-Ken (JP); Citizen Holdings Co., Ltd., Tokyo (JP); Panasonic Corporation, Osaka (JP)

( * ) Notice: Subject to any disclaimer, the term of this patent is extended or adjusted under 35 U.S.C. 154(b) by 0 days.

(21) Appl. No.: 13/581,135

(22) PCT Filed: Feb. 23, 2011

(86) PCT No.: PCT/JP2011/053936
§ 371 (c)(1),
(2), (4) Date: Aug. 24, 2012

(87) PCT Pub. No.: WO2011/105409
PCT Pub. Date: Sep. 1, 2011

(65) Prior Publication Data
US 2012/0313135 A1 Dec. 13, 2012

(30) Foreign Application Priority Data
Feb. 24, 2010 (JP) .................. 2010-039060

(51) Int. Cl.
*H01L 33/00* (2010.01)

(52) U.S. Cl.
USPC 257/99; 257/692; 257/E33.056; 257/E33.057; 257/E33.058; 438/26

(58) Field of Classification Search
CPC .... H01L 25/0753; H01L 25/167; H01L 25/13
See application file for complete search history.

(56) References Cited

U.S. PATENT DOCUMENTS

| | | | |
|---|---|---|---|
| 5,914,859 A * | 6/1999 | Takada et al. | 361/704 |
| 8,575,639 B2 * | 11/2013 | Hussell | 257/98 |
| 2006/0118804 A1 * | 6/2006 | Nagai et al. | 257/98 |
| 2006/0147746 A1 * | 7/2006 | Wakako et al. | 428/627 |
| 2007/0176198 A1 * | 8/2007 | Lee et al. | 257/99 |
| 2009/0095967 A1 * | 4/2009 | Masui et al. | 257/98 |

FOREIGN PATENT DOCUMENTS

| | | |
|---|---|---|
| JP | 06181268 A | 6/1994 |
| JP | 1022589 A | 1/1998 |
| JP | 3083557 U | 11/2001 |
| JP | 2001326390 A | 11/2001 |

* cited by examiner

*Primary Examiner* — Julio J Maldonado
*Assistant Examiner* — Molly Reida
(74) *Attorney, Agent, or Firm* — Browdy and Neimark, PLLC

(57) ABSTRACT

A mounting board including a pair of patterned electrodes, a lower surface and an upper surface opposed thereto on which a substrate of an electronic component is to be mounted, a pass-through hole penetrating through the upper surface and the lower surface, and a peripheral side surface that defines the pass-through hole. The pass-through hole includes a plurality of penetrating grooves that are cut into the mounting board and penetrate through the upper and lower surfaces. The plurality of penetrating grooves electrically split the pair of patterned electrodes. The pair of patterned electrodes is partly positioned inside the peripheral side surface, and a connection portion connecting the at least one pair of patterned electrodes and at least one pair of patterned electrodes provided on the upper surface of the substrate of the electronic component is to be disposed inside the peripheral side surface that defines the pass-through hole.

21 Claims, 9 Drawing Sheets

MOUNTING BOARD AND STRUCTURE OF THE SAME

TECHNICAL FIELD

The present invention relates to a mounting board to mount an electronic component such as an IC or a light-emitting diode. More particularly, the invention relates to a mounting board, from a lower surface of which, an electronic component is to be mounted, and a structure of the mounting board on that the electronic component is mounted.

BACKGROUND ART

As shown in FIGS. 9 and 10, as an example of an electronic component to be mounted on a mounting board, there is shown a light-emitting diode. The light-emitting diode 2 has a light-emitting element 4, a substrate 6 on which the light-emitting element 4 is mounted, and a pair of patterned electrodes 8 and 10, which are formed to extend from the upper surface to the side surfaces of the substrate 6, or a pair of through hole electrodes 12. Note that the light-emitting element 4 is electrically connected to the pair of patterned electrodes 8 and 10 or the pair of through hole electrodes 12 and then sealed in a resin. The light-emitting are of the light-emitting diode 2 includes the light-emitting element 4 and a resin portion for sealing the light-emitting element 4. A mounting board 16 has a pass-through hole 14, so that the light-emitting area of the light-emitting diode 2 is inserted into the pass-through hole 14 of the mounting board 16. The light-emitting diode 2 is mounted by inserting the light-emitting area of the light-emitting diode 2 into the pass-through hole 14; allowing part of the upper surface of the substrate 6, on which the light-emitting element 4 has been mounted, to be brought into contact with the lower surface of the mounting board 16 such as a circuit board; and then soldering the pair of patterned electrodes 8 and 10 or the pair of through hole electrodes 12 to a pair of patterned electrodes 18 provided on the lower surface of the mounting board 16 to form a solder fillet 20, respectively (for example, see Patent Literature 1).

In this manner, the light-emitting diode 2 can be mounted by allowing part of the upper surface of the substrate 6 of the light-emitting diode 2 to be brought into contact with the lower surface of the mounting board 16, so that the light-emitting area of the light-emitting diode 2 composed of the light-emitting element 4 and the resin portion in which the light-emitting element 4 is sealed is received within the pass-through hole 14 of the mounting board 16. This makes it possible to reduce the overall thickness when compared with the case of mounting the light-emitting diode 2 not in the pass-through hole but on a surface of the mounting board 16. However, the solder fillet 20 for soldering the light-emitting diode 2 is located on the lower surface of the mounting board 16 and cannot be seen from above the upper surface of the mounting board 16. Thus, the solder fillet 20 cannot be visually checked, so that the mounting board 16 had to be turned upside down in order to check the condition of the solder. On the other hand, as shown in FIG. 11, the solder 21 that is located between the lower surface of the mounting board 16 and the upper surface of the substrate 6 of the light-emitting diode could not be visually checked from outside, thereby raising the problem of a check being required to be made by means of X-ray or the like.

It was thus necessary to provide at least the pair of patterned electrodes 8 and 10 which extend around the side surfaces of the substrate 6 of the light-emitting diode or the pair of through hole electrodes 12 which penetrate through the substrate 6. However, a light-emitting diode with a substrate having a metal base such as of aluminum and a wiring plate superimposed one on the other would be more expensive than one with an insulating substrate because it is difficult to provide the patterned electrodes extending around the side surfaces and the through hole electrodes. Accordingly, as shown in FIG. 12, it has been suggested that a wiring plate 24 should be set to be greater than a base 22 so as to allow a pair of electrode portions 26 provided respectively on a pair of opposite ends of the wiring plate 24 to overhang and to be thereby soldered to the lower surface of a mounting board 28 (for example, see Patent Literature 2).

However, when the base 22 was provided with a heat sink 30, the soldered portion of the light-emitting diode shown in FIG. 12 could be visually checked with difficulty even when turned upside down. Furthermore, the overhang portion of the wiring plate 24 had a low strength and thus tended to be damaged when subjected to, for example, the weight of the base 22 or the heat sink 30.

CITATION LIST

Patent Literature

[Patent Literature 1] Japanese Patent Application Laid-Open No. 2001-326390 (FIGS. 1, 4, and 7)
[Patent Literature 2] Publication of Japanese Utility Model Registration No. 3083557 (FIG. 4)

SUMMARY OF INVENTION

Technical Problem

The challenges to be addressed by the present invention are to provide a mounting board and a structure of the same which solve the conventional technical problems mentioned above and which enables the condition of solder or a connection portion between the substrate of an electronic component having been mounted and the mounting board to be visually checked from above the upper surface of the mounting board.

Solution to Problems

A mounting board of the present invention is to mount thereon an electronic component and more specifically, to mount the upper surface of the substrate of the electronic component onto the lower surface of the mounting board having a pass-through hole. A connection portion for connecting between at least one pair of patterned electrodes provided on the substrate of the electronic component and at least one pair of patterned electrodes on the mounting board is located inside the peripheral side surface defining the pass-through hole of the mounting board. This mounting board is configured such that at least part of the at least one pair of patterned electrodes of the electronic component and at least part of the at least one pair of patterned electrodes of the mounting board are disposed inside the peripheral side surface defining the pass-through hole, and a connection portion for connecting, inside the peripheral side surface defining the pass-through hole, between at least part of the at least one pair of patterned electrodes of the electronic component and at least part of the at least one pair of patterned electrodes of the mounting board is provided inside the pass-through hole. This makes it possible to visually check the condition of connection.

Furthermore, the at least one pair of patterned electrodes of the mounting board are provided along the pass-through hole that penetrates through the upper and lower surfaces of the mounting board, and extend from the upper surface of the mounting board to the lower surface of the mounting board across the peripheral side surface defining the pass-through hole (a cross section of the mounting board within the pass-through hole). The at least one pair of patterned electrodes of the mounting board include a plurality of patterned electrodes, each being provided independently along the pass-through hole. More specifically, the plurality of patterned electrodes are electrically split to form as a plurality of independent patterned electrodes by providing a plurality of penetrating grooves which are cut into the mounting board from the peripheral side surface defining the pass-through hole so as to penetrate through the upper and lower surfaces.

Furthermore, the pass-through hole is made up of a combination of a plurality of independent small pass-through holes smaller than the pass-through hole and a punched hole punched at a position adjacent to the small pass-through holes and linking the plurality of small pass-through holes. Each of the plurality of patterned electrodes is formed to extend from the upper surface of the mounting board across the peripheral side surface defining the plurality of independent small pass-through holes to the lower surface of the mounting board. The patterned electrode extending across the peripheral side surface of the small pass-through hole extends from the upper surface of the mounting board across the respective peripheral side surfaces defining the plurality of small pass-through holes to the lower surface.

Furthermore, the connection portions are disposed to be located inside the respective peripheral side surfaces defining the plurality of small pass-through holes. Furthermore, the punched hole is formed at a position corresponding to the center of the electronic component and receives therein, for example, the light-emitting area of a light-emitting diode. Furthermore, the at least one pair of patterned electrodes of the mounting board are provided to extend along the pass-through hole of the mounting board from the upper surface of the mounting board across the peripheral side surface that defines the pass-through hole to the lower surface of the mounting board. The at least one pair of patterned electrodes are, at the lower surface of the mounting board, to be in contact with the at least one pair of patterned electrodes disposed on the upper surface of the substrate of the electronic component.

Furthermore, the at least one pair of patterned electrodes of the mounting board are connected by soldering, inside the peripheral side surface defining the pass-through hole, to the at least one pair of patterned electrodes disposed on the upper surface of the substrate of the electronic component and extending inwardly of the pass-through hole past the peripheral side surface defining the pass-through hole of the mounting board. The soldered connection portion appears within the pass-through hole of the mounting board and is visually seen from above the upper surface of the mounting board.

Furthermore, the plurality of penetrating grooves are formed radially from the peripheral side surface defining the pass-through hole so as to be cut into the mounting board, and furthermore, the patterned electrodes formed in between the plurality of penetrating grooves are provided along the circumference of the pass-through hole. Furthermore, on the surface of the mounting board, it is also acceptable to provide each patterned electrode with a patterned conductor extending radially from each of the plurality of patterned electrodes with the pass-through hole at the center. Furthermore, the electronic component includes, for example, a light-emitting diode.

On the other hand, a mounting structure with the aforementioned mounting board is configured as follows. For example, suppose the case where the electronic component may include: a substrate made up of a metal base and a wiring plate, the wiring plate being disposed on the upper surface of the base and having at least one pair of patterned electrodes; and at least one semiconductor device electrically connected to the at least one pair of patterned electrodes of the wiring plate. In this case, the mounting board includes: at least one pair of patterned electrodes; an upper surface; a lower surface that is opposed to the upper surface and on that an upper surface of the substrate of the electronic component is mounted, the substrate having the at least one semiconductor device mounted on the upper surface thereof; at least one pass-through hole penetrating through the upper surface and the lower surface; and a peripheral side surface defining the pass-through hole. Thus, the at least one pair of patterned electrodes is partly positioned inside the peripheral side surface that defines the pass-through hole. A connection portion for connecting between the connection of the at least one pair of patterned electrodes of the mounting board and the at least one pair of patterned electrodes of the electronic component is disposed inside the peripheral side surface that defines the pass-through hole. Note that the connection portion appears within the at least one pass-through hole and is visually seen when viewed from above the upper surface of the mounting board. Furthermore, in the present invention, the semiconductor device may be a light-emitting element.

Advantageous Effects of Invention

The mounting board of the present invention for mounting thereon an electronic component has an upper surface, a lower surface, a pass-through hole penetrating the upper surface and the lower surface, a peripheral side surface that defines the pass-through hole, and at least one pair of patterned electrodes extending along the pass-through hole from the upper surface to the lower surface across the peripheral side surface. On the other hand, the upper surface of the substrate of the electronic component is mounted on the lower surface of the mounting board, and at least part of at least one pair of patterned electrodes provided on the upper surface of the substrate of the electronic component is disposed to be located inside the pass-through hole past the peripheral side surface that defines the pass-through hole of the mounting board. The electronic component is mounted on the mounting board inside the peripheral side surface that defines the pass-through hole by soldering an electrically conductive portion to the connection of a patterned electrode. Accordingly, when viewed from above the upper surface of the mounting board, a solder fillet or a connection portion is seen within the pass-through hole, allowing the condition of the solder to be visually checked with ease.

Furthermore, the plurality of patterned electrodes provided along the pass-through hole of the mounting board are split into a plurality of independent patterned electrodes by a plurality of penetrating grooves which are cut into the mounting board so as to penetrate through the upper and lower surfaces from the peripheral side surface that defines the pass-through hole. Accordingly, the mounting board can be easily adapted only by modifying the number and position of penetrating grooves to various electronic component substrates having different numbers and positions of patterned electrodes.

Furthermore, the mounting board of the present invention can be used to easily mount thereon even an electronic component such as a light-emitting diode with a metal base in which a through hole electrode is difficult to form. Furthermore, the mounting board can be provided on the upper surface thereof with a patterned conductor for circuit wiring in order to provide a sufficient dielectric strength distance between the patterned conductor and the electronic component, thereby providing enhanced reliability.

Furthermore, for a light-emitting diode employed as the electronic component, most of the patterned electrodes or the like on the light emission side of the light-emitting diode are to be hidden below the mounting board. It is thus possible to visually simplify the outer appearance of the light emission side of the light-emitting diode.

DESCRIPTION OF EMBODIMENTS

A mounting board of the present invention has a pass-through hole which receives the upper surface of the substrate of an electronic component to be mounted on the lower surface of the mounting board and at least part of a patterned electrode. To mount the electronic component onto the lower surface of the mounting board, the mounting board and the electronic component are superimposed so as to allow the electronic component and a connection of the patterned electrode to be accommodated inside the pass-through hole. Then, the connection of the patterned electrode and the connection of a patterned electrode, which is provided on the mounting board and along the pass-through hole, are connected to each other by means of soldering. This makes it possible to check the solder inside the pass-through hole from above the upper surface of the mounting board.

First Embodiment

Figure 1:
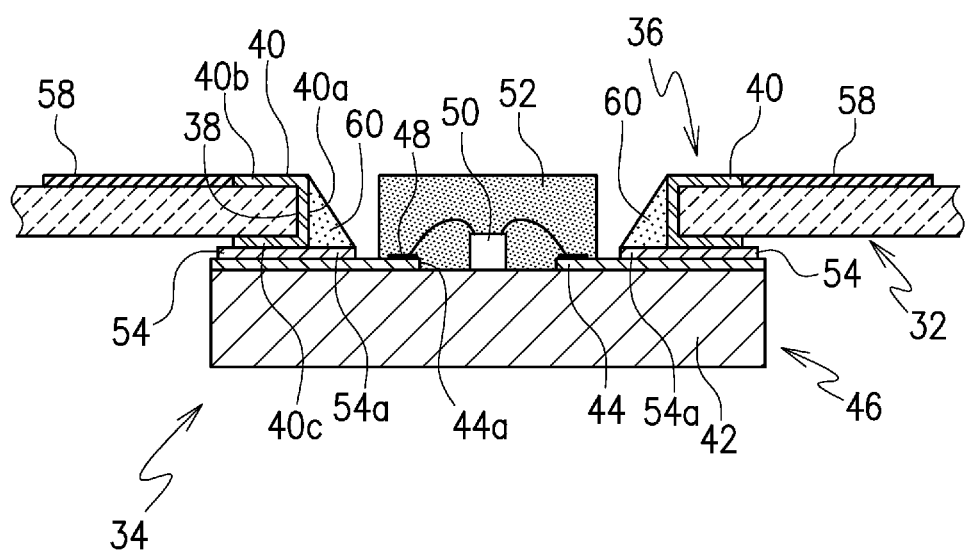
FIG. 1 is a cross-sectional view illustrating a mounting board according to a first embodiment of the present invention and the mounting condition of a light-emitting diode as an electronic component mounted from below the lower surface of the mounting board.
Figure 2:
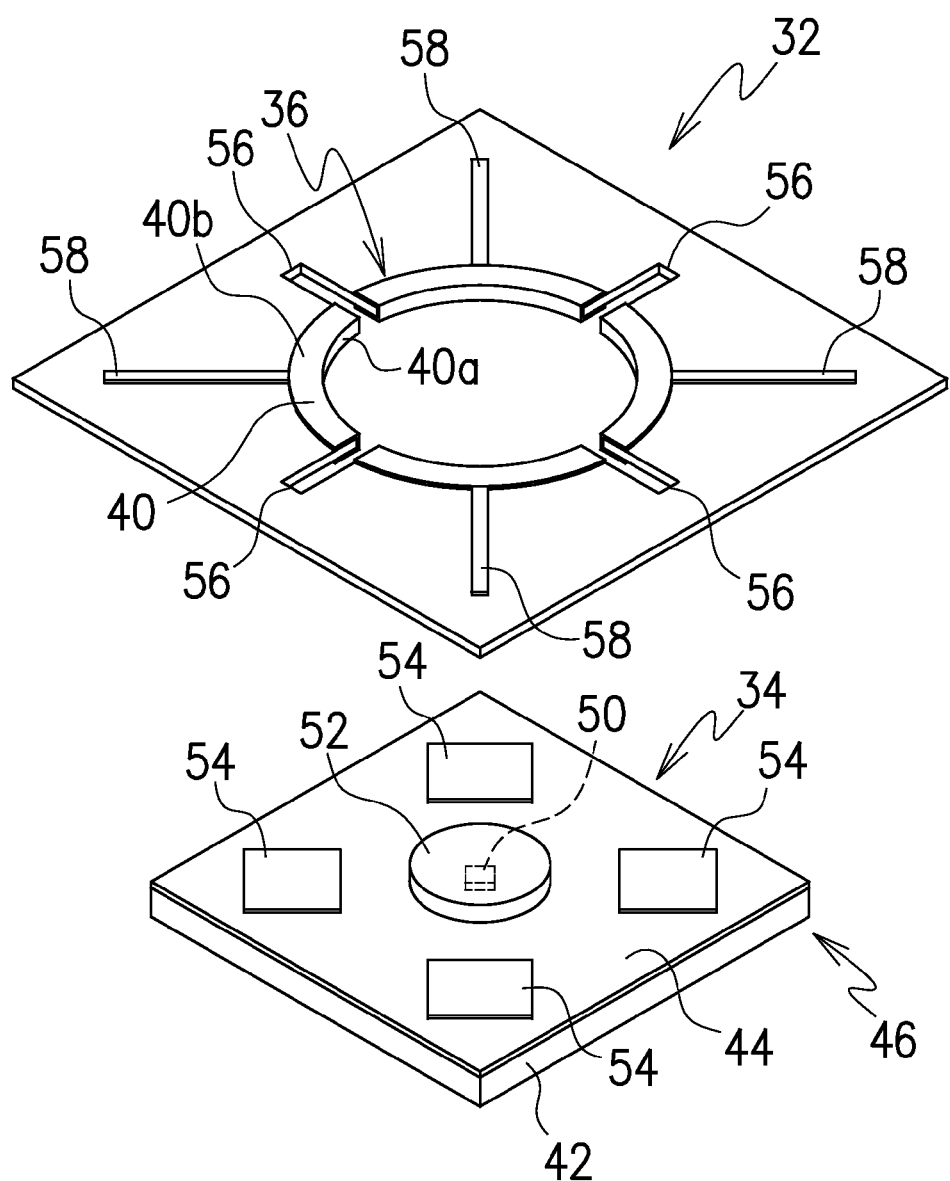
FIG. 2 is an exploded perspective view illustrating the mounting board and the light-emitting diode of FIG. 1 being separated from each other.
Figure 3:
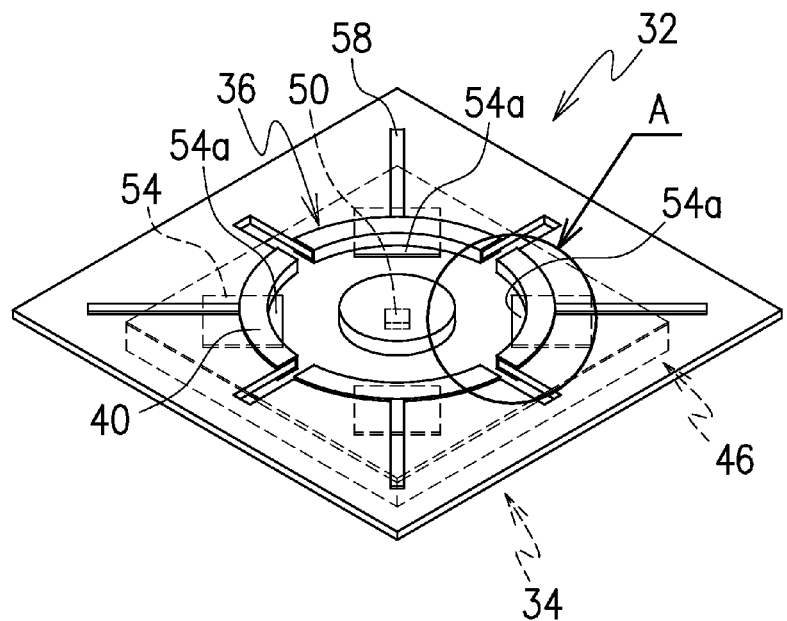
FIG. 3 is a perspective view illustrating the mounting board of FIG. 2 on which the light-emitting diode is mounted.
Figure 4:
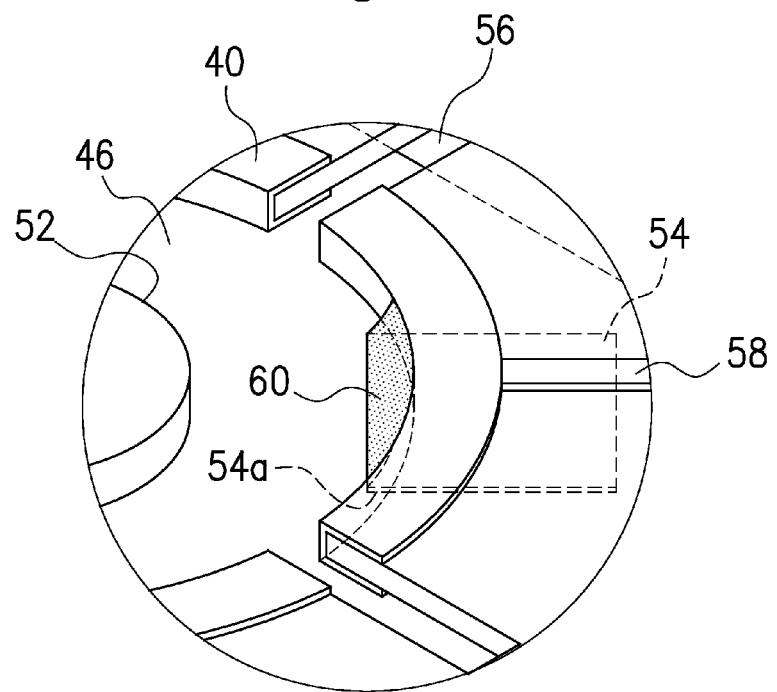
FIG. 4 is an expanded view of portion A of FIG. 3, showing a solder fillet formed at a connection between a patterned electrode of the mounting board and an electrode of the electronic component.

FIG. 1 is a cross-sectional view showing the upper surface of the substrate of a light-emitting diode, as an electronic component, mounted on the lower surface of a mounting board, according to a first embodiment of the present invention. FIG. 2 is an exploded perspective view illustrating the mounting board and the light-emitting diode. FIG. 3 is a perspective view illustrating the light-emitting diode mounted on the mounting board, and FIG. 4 is an expanded view of portion A of FIG. 3. Reference numeral 32 denotes the mounting board, on the lower surface of which the upper surface of the substrate of the electronic component is mounted. Reference numeral 34 denotes a light-emitting diode as the electronic component. The light-emitting diode 34 according to the present embodiment includes: a substrate 46 having a metal base 42 such as of aluminum and a wiring plate 44, the wiring plate 44 being disposed on the upper surface of the base and having at least one pair of patterned electrodes; and at least one light-emitting element 50 electrically connected to the at least one pair of patterned electrodes of the wiring plate 44.

The light-emitting element 50 is mounted on the upper surface of the base 42 so as to be seen through a pass-through hole provided in the wiring plate 44 of the substrate 46 of the light-emitting diode, and electrically connected to the at least one pair of patterned electrodes on the upper surface of the wiring plate 44. More specifically, the light-emitting element 50 is die bonded to the center of the upper surface of the base 42 through a pass-through hole 44a of the wiring plate 44 and electrically connected via wire to the at least one pair of patterned electrodes 54 on the wiring plate 44. Then the light-emitting element 50 is sealed in a transparent or translucent sealing resin 52. Only one light-emitting element 50 is illustrated in FIG. 1 for simplicity of drawing; however, it is also acceptable to employ a light-emitting diode which includes a plurality of light-emitting elements disposed in multiple arrays.

The upper surface of the wiring plate 44 is provided with the at least one pair of patterned electrodes 54. Reference numeral 48 denotes a wire bonding portion which is electrically connected to the light-emitting element 50. Although not illustrated, the bonding portion 48 is electrically connected to the at least one pair of patterned electrodes 54 on the wiring plate 44. The light-emitting area of the light-emitting diode in the present embodiment includes the light-emitting element 50 and the generally cylindrical sealing resin 52 that seals the light-emitting element therein. The at least one pair of patterned electrodes 54 are disposed on the upper surface of the substrate of the light-emitting diode, and the patterned electrode 54 has a generally rectangular planar shape, with a portion close to the sealing resin 52 being a connecting portion 54a to the mounting board 32. Note that the wiring plate 44 of the substrate of the light-emitting diode is formed of an insulating material.

The mounting board 32 is formed of an insulating substrate, such as an alumina substrate, which is greater in outer shape than the light-emitting diode 34 when viewed in plan view. The mounting board 32 may be provided with a plurality of pass-through holes for mounting multiple electronic components thereon, or alternatively, may allow for mounting one electronic component thereon as shown in the present embodiment. The mounting board 32 according to the present embodiment has a generally square shape in plan view and a pass-through hole 36 at the center. Along the pass-through hole 36, the at least one pair of patterned electrodes of the mounting board are provided. More specifically, each of the at least one pair of patterned electrodes is formed to extend from the upper surface of the mounting board across a peripheral side surface 38 defining the pass-through hole (a cross section of the mounting board within the pass-through hole) to the lower surface of the mounting board.

The pass-through hole 36 includes a diameter within that the light-emitting area of the light-emitting diode 34 and the connecting portion 54a are positioned. The connecting portion 54a is a part of at least one pair of electrode patterns 54 that are disposed on an upper surface of a substrate in the light-emitting diode and are to be connected to at least one pair of patterned electrodes of the mounting board. Note that the light-emitting area of the light-emitting diode 34 includes the light-emitting element 50 and the sealing resin 52 sealing the light-emitting element transmits light emitted from the light-emitting element.

Furthermore, on the peripheral side surface of the mounting board 32, the peripheral side surface (that is a cross section of the mounting board within the pass-through hole) defining the pass-through hole 36, there is at least one pair of patterned electrodes 40 provided. The patterned electrode 40 includes a connecting portion(s) 40a positioned on the peripheral side surface that defines the pass-through hole 36, a patterned electrode 40b located on the upper surface of the mounting board 32, and a patterned electrode 40c located on the lower surface of the mounting board 32. Furthermore, the mounting board 32 includes a plurality of penetrating grooves 56 which are cut into the mounting board 32 from the peripheral side surface that defines the pass-through hole 36 (that is a cross section of the mounting board within the pass-through hole) and penetrate through the upper and lower surfaces of the mounting board 32. In the present embodiment, the at least one pair of patterned electrodes 40 provided on the mounting board 32 are split by four penetrating grooves 56 into four independent patterned electrodes. Note that the number of patterned electrodes separated by the penetrating grooves 56 can be set according to the number of the patterned electrodes of the electronic component to be mounted. In the present embodiment, since the light-emitting diode has four patterned electrodes, the mounting board 32 is set to have the four patterned electrodes 40.

Furthermore, the upper surface of the mounting board 32 is also provided with a plurality of electrode wiring pattern 58 which extend radially from the patterned electrode 40 with the pass-through hole 36 at the center. The electrode wiring pattern 58 can be used, for example, for connecting to or mounting circuits, power supplies, or the like.

To form the patterned electrode 40 of the mounting board 32 configured as mentioned above, the mounting board 32 is first provided with the pass-through hole 36, and coated with resist excluding the portion at which the patterned electrode 40 is to be formed. After that, the patterned electrode 40 is formed by vapor deposition, plating or the like, and then the resist is removed, thereby forming a patterned electrode which is similar to typical through hole electrodes. Subsequently, the penetrating grooves 56 are formed by means of a molding die or a router, thereby splitting the integrated patterned electrode 40 into a plurality of independent patterned electrodes 40.

A description will next be made as to how the upper surface of the substrate 46 of the light-emitting diode 34 is mounted onto the lower surface of the mounting board 32 configured as mentioned above. As shown in FIGS. 2 and 3, the lower surface of the mounting board 32 is superimposed on the upper surface of the substrate 46 of the light-emitting diode 34 so as to locate the light-emitting element 50 at the center of the pass-through hole 36 of the mounting board 32. This allows the connecting portion 54a or at least part of the at least one pair of patterned electrodes 54 provided on the upper surface of the substrate 46 of the light-emitting diode to be laid within the pass-through hole 36 of the mounting board 32. Furthermore, at this time, the at least one pair of patterned electrodes 40 of the mounting board 32 provided along the pass-through hole 36 are configured such that the patterned electrode 40c extended to locate on the lower surface of the mounting board 32 is brought into contact with the at least one pair of patterned electrodes 54 provided on the upper surface of the substrate 46 of the light-emitting diode 34. Here, the at least one pair of patterned electrodes 40 of the mounting board 32 include the connecting portion(s) 40a that is/are positioned on the peripheral side surface that defines the pass-through hole 36 to serve as a connection, so that the connecting portion 40a of the patterned electrode 40 is connected by soldering to the connecting portion 54a or at least part of the at least one pair of patterned electrodes 54 provided on the upper surface of the substrate 46 of the light-emitting diode 34. A connection portion 60 formed at this time is a solder fillet and shows the connection portion between the connection of the patterned electrode of the mounting board 32 and the connection of the patterned electrode provided on the upper surface of the substrate of the electronic component. As shown in FIGS. 1 and 4, it is possible to see the connection portion 60 from above the upper surface of the mounting board 32, allowing for visually checking the condition of the solder with ease.

Note that the mounting board 32 according to the present embodiment may be used to be mounted on circuit boards or the like, or alternatively, circuits may be formed on the mounting board 32.

Second Embodiment

Now, referring to FIGS. 5 to 8, a description will be made to a mounting board 32 of a second embodiment which has a modified pass-through hole 36. Note that in this embodiment, the pass-through hole is partially different in structure from that of the first embodiment, but the other configuration, the material of each portion, the conditions of mounting and the like are the same as those of the first embodiment. Thus, the same portions as those of the first embodiment will be denoted with the same symbols without detailed descriptions. The pass-through hole 36 of the first embodiment was set to have such a diameter that receives therein the light-emitting area of the light-emitting diode and the connecting portion 54a, and had a substantially circular shape in plan view. The connecting portion 54a was at least part of the at least one pair of patterned electrodes 54 provided on the upper surface of the substrate 46 of the light-emitting diode 34 and connected to a plurality of the patterned electrodes 40 of the mounting board 32. Accordingly, the pass-through hole 36 has to be formed to be greater than pass-through holes for forming typical through hole electrodes simply to provide electrical continuity between the upper and lower surfaces.

Figure 5:
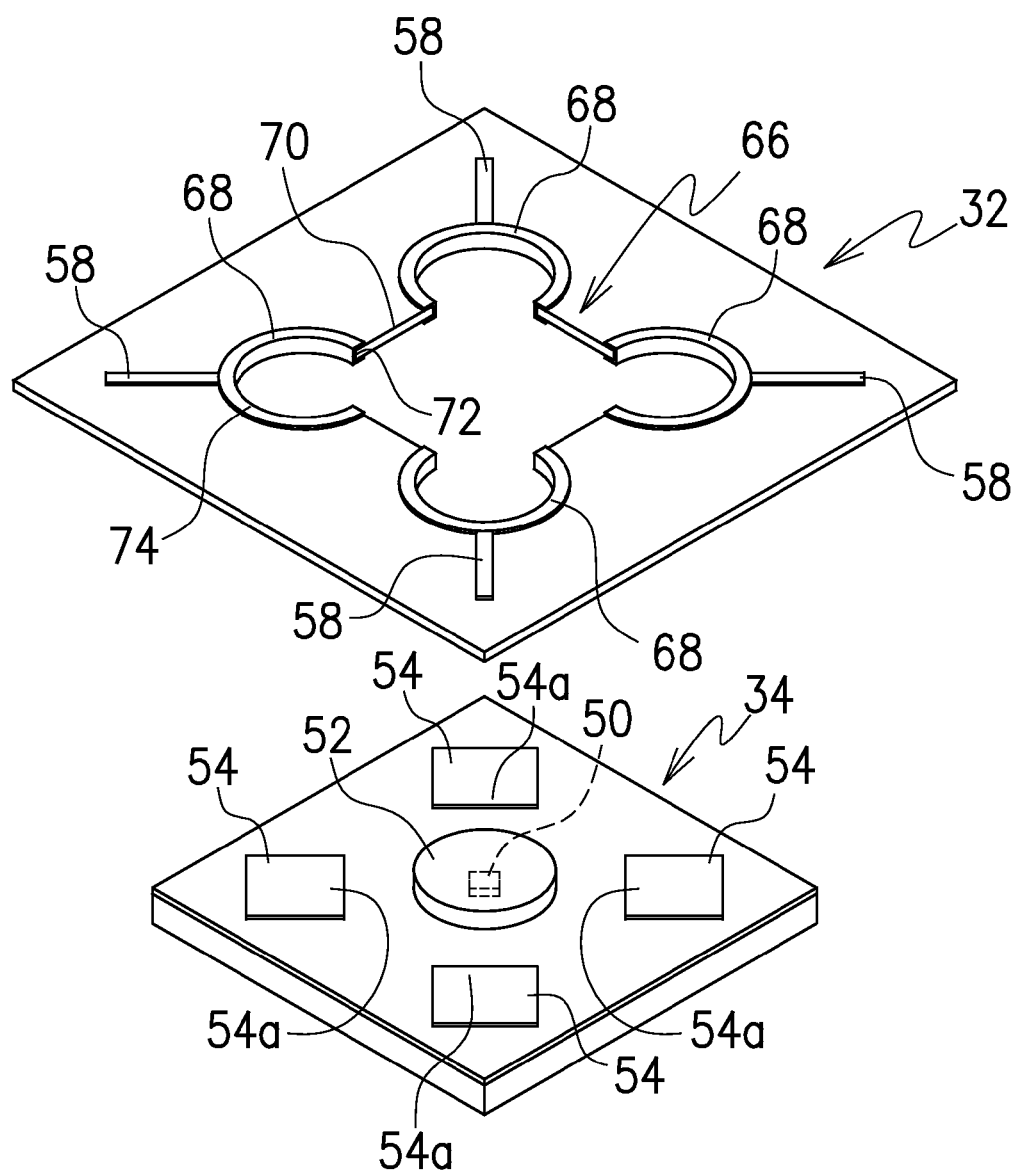
FIG. 5 is a perspective view illustrating a mounting board according to a second embodiment of the present invention and a light-emitting diode as an electronic component.
Figure 6:
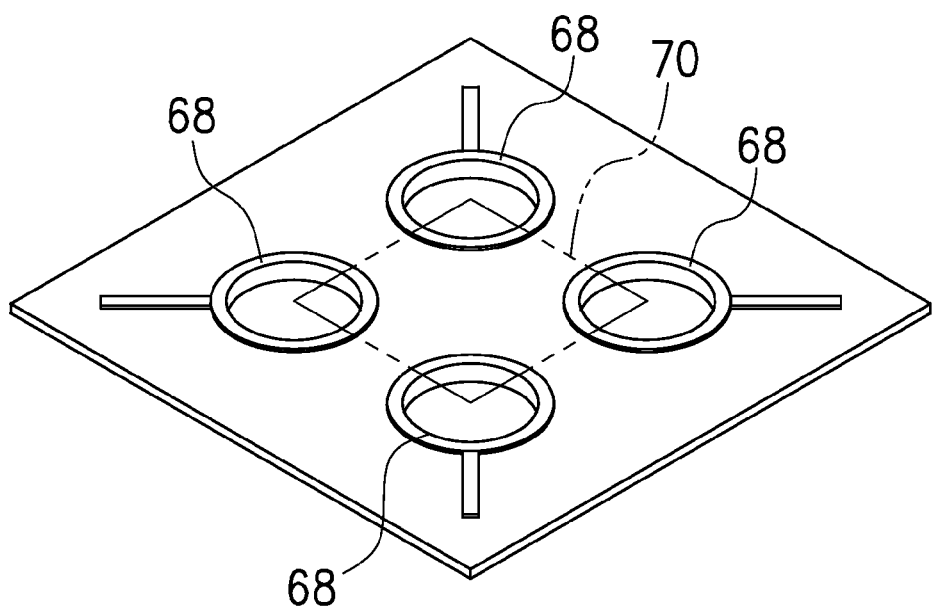
FIG. 6 is a perspective view illustrating the positional relationship between a plurality of small pass-through holes and a punched hole shown in FIG. 5.

In contrast to this, in the second embodiment, a pass-through hole 66 of the mounting board 32 shown in FIG. 5 is configured, as shown in FIG. 6, such that a plurality of pass-through holes 68 which are each smaller in diameter than the pass-through hole 66 are provided in conjunction with a punched hole which links the plurality of small pass-through holes 68 by punching the mounting board 32 at a position adjacent thereto. The pass-through hole 66 is formed of the four small pass-through holes 68 which partially overlap the punched hole, which is quadrangular in plan view, at the respective four corners thereof so as to be linked to each other with the punched hole 70 at the center.

In the mounting board 32 shown in FIG. 5, the plurality of small pass-through holes 68 are disposed at the respective positions that correspond to the connecting portion 54a of the at least one pair of patterned electrodes 54 provided on the upper surface of the substrate of the light-emitting diode 34. In this embodiment, since the substrate of the light-emitting diode 34 is provided on the upper surface thereof with the four patterned electrodes 54, the four small pass-through holes 68 are provided corresponding thereto. The small pass-through hole 68 extends from the upper surface of the mounting board 32 to the lower surface across the peripheral side surface that defines the respective small pass-through holes 68 (a cross section of the mounting board within the small pass-through hole). The portion of the patterned electrode extending inwardly past the peripheral side surface that defines the small pass-through hole 68 serves as the connecting portion 54a. Note that the pass-through hole 66 of the mounting board is set to have such a diameter that receives, within the pass-through hole 66, each of the connecting portion 54a of the plurality of patterned electrodes 54 provided on the upper surface of the substrate of the light-emitting diode 34.

Furthermore, the punched hole 70 is formed by punching the center of the mounting board 32 while the corners of the punched hole 70 are oriented so as to partially overlap the respective small pass-through holes 68. Accordingly, the plurality of small pass-through holes 68 are linked to each other by the punched hole 70 to form the single pass-through hole 66.

As described above, the pass-through hole 66 according to the present embodiment is a combination of the plurality of small pass-through holes 68 and the punched hole 70. Furthermore, patterned electrodes 74 are provided along the originally independent small pass-through holes 68, and each partially cut and spaced apart from each other by the punched hole 70 and completely independent of each other in the same manner as with the patterned electrodes 40 of the first embodiment. Accordingly, in the same manner as in the first embodiment, the substrate of the light-emitting diode 34 can be mounted onto the mounting board 32 by soldering each connection of the plurality of the patterned electrodes 74 of the mounting board 32 to each of the connecting portion 54a of the plurality of patterned electrodes 54 provided on the upper surface of the substrate of the light-emitting diode 34, within each of the small pass-through holes 68.

Note that the number of the small pass-through holes 68 and the planar shape of the punched hole 70, which determine the number of patterned electrodes of the mounting board, are set according to the number of patterned electrodes provided on the substrate of the electronic component to be mounted. For example, when the electronic component to be mounted has three patterned electrodes 54, three small pass-through holes 68 are to be formed, and the planar shape of the punched hole 70 may be set to be triangular so that the three small pass-through holes and the three vertices each partially overlap with each other. On the other hand, for a number of patterned electrodes 54 of the electronic component to be mounted and a number of small pass-through holes 68 corresponding thereto, the planar shape of the punched hole 70 can be set to be polygonal according to those numbers, or alternatively, as will be discussed below, the planar shape of the punched hole 70 may be set to be circular.

Figure 7:
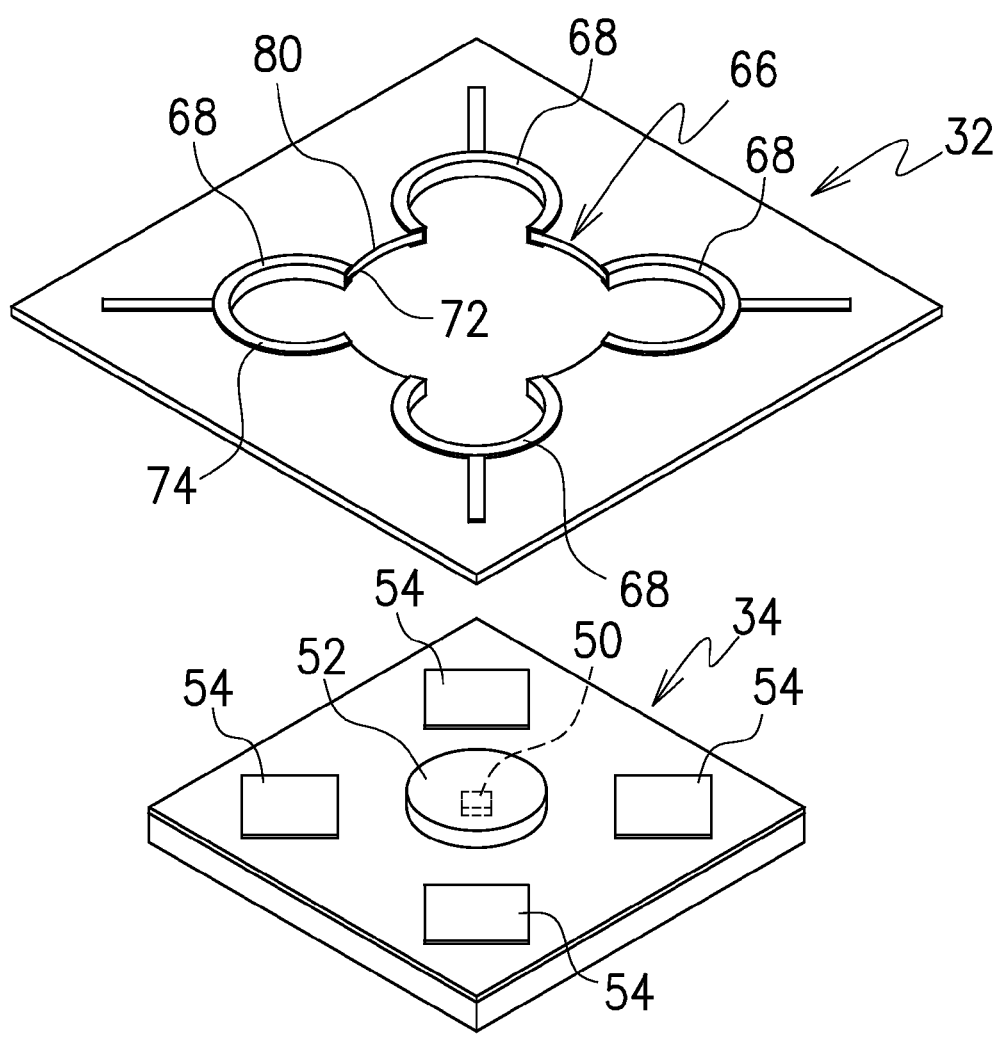
FIG. 7 is a perspective view illustrating an example of the punched hole of FIG. 5 having a modified planar shape.
Figure 8:
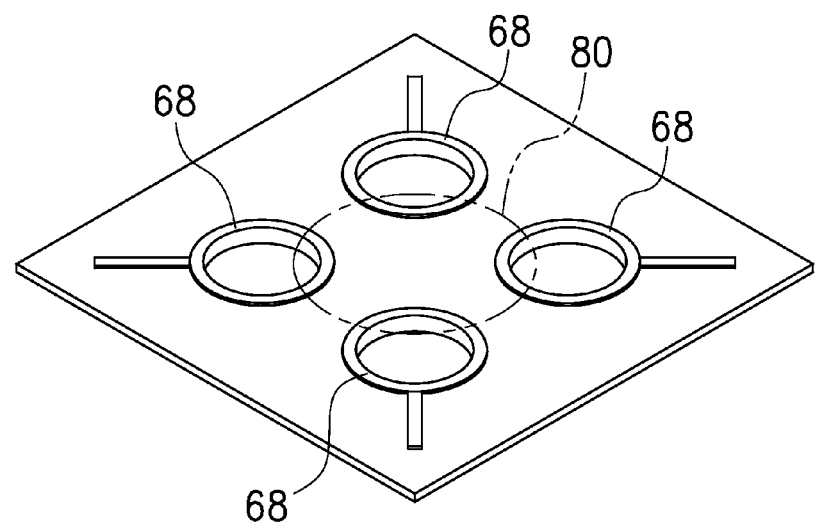
FIG. 8 is a perspective view illustrating the positional relationship between the plurality of small pass-through holes and the punched hole shown in FIG. 7.
Figure 9:
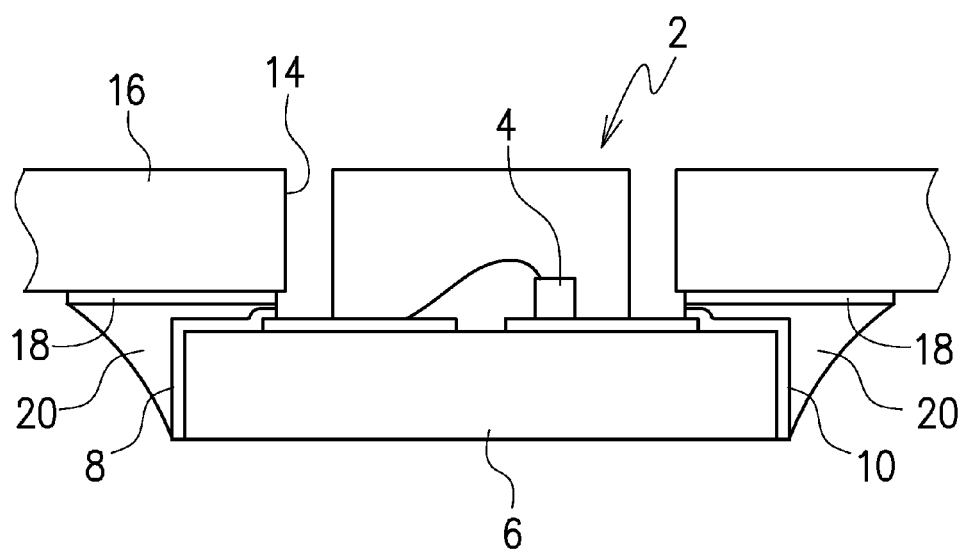
FIG. 9 is a cross-sectional view illustrating an example of an electronic component which is mounted on the lower surface of a conventional mounting board.
Figure 10:
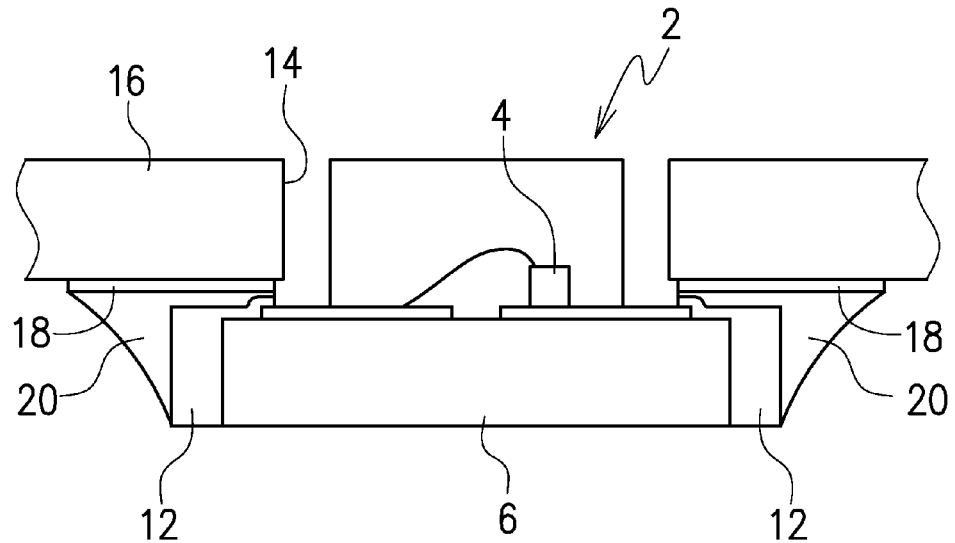
FIG. 10 is a cross-sectional view illustrating another example of an electronic component which is mounted on the lower surface of a conventional mounting board.
Figure 11:
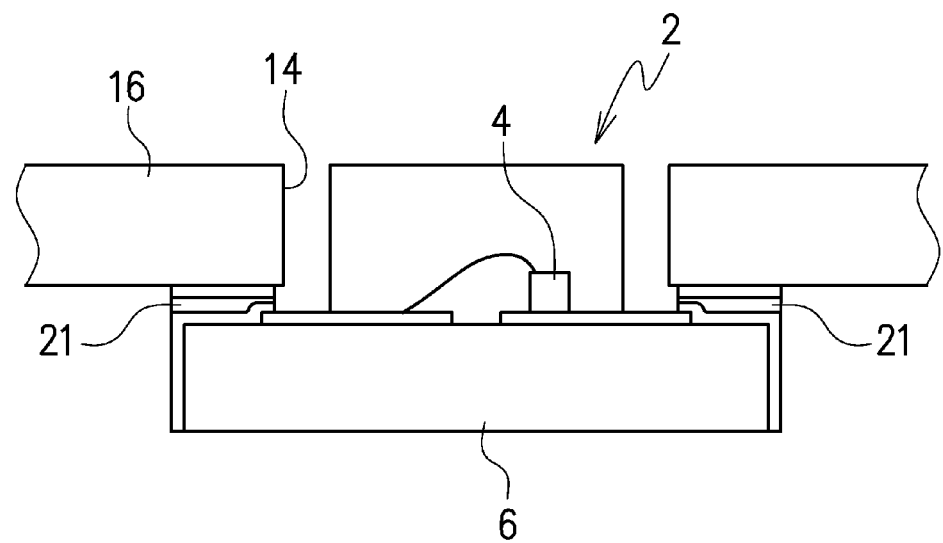
FIG. 11 is a cross-sectional view illustrating still another example of an electronic component which is mounted on the lower surface of a conventional mounting board.
Figure 12:
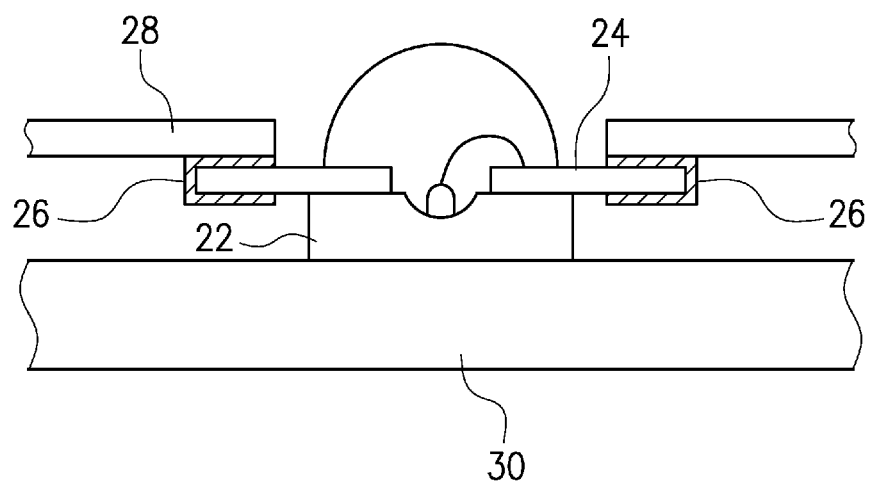
FIG. 12 is a cross-sectional view illustrating a light-emitting diode, as an electronic component with a conventional metal base, which is provided with a heat sink.

That is, as shown in FIGS. 7 and 8, a punched hole 80 is formed which is given a circular planar shape so as to partially overlap each of the small pass-through holes 68 that are formed in multiples corresponding to the number of the patterned electrodes 54 provided on the substrate of the electronic component. For the punched hole 80 being circular as above, the plurality of small pass-through holes 68 can be located at any positions along the circumference of the punched hole 80 so long as the positions allow for partially overlapping the punched hole 80. It is thus possible to provide high degree of flexibility in the position and the number of small pass-through holes 68.

In the present embodiment described above, the small pass-through holes 68 need not to be set to have a particularly large diameter, thus allowing the pass-through holes 68 to be formed without using special facilities or tools. Furthermore, the punched holes 70 and 80 can be easily shaped or positioned as compared with the penetrating grooves 56 of the first embodiment, and thus can be formed with ease.

Furthermore, in the present embodiment configured as mentioned above, soldering of the at least one pair of patterned electrodes 54 provided on the upper surface of the substrate of the light-emitting diode 34 to the at least one pair of patterned electrodes 74 of the mounting board 32 can be performed in a space or a pass-through hole, and the size of the pass-through hole can be expanded by providing a plurality of small pass-through holes 68 so as to provide improved workability. In particular, since the plurality of small pass-through holes 68 are linked to each other with the punched hole 70 or 80 at the center, the mounting space can be further expanded toward the center of the mounting board 32, thereby providing further improved workability.

Note that although the light-emitting diode was taken as an example of an electronic component in the aforementioned first and second embodiments, other electronic components such as IC's or LSI's can also be mounted on the mounting board while assuring the visibility of the solder in the same manner so long as the electronic components are designed to be mounted on substrates.

Furthermore, the mounting board of the present invention may also be incorporated into electronic appliances such as personal computers and cellular phones; home electrical products; or various types of devices such as automobile instruments and panels. As such, the mounting board of the present invention which is incorporated into these various types of devices enables, even in those devices, the condition of the connection portions between the patterned electrodes provided on the upper surface of the substrate of the electronic component and the patterned electrodes of the mounting board to be checked from above the upper surface of the mounting board.

REFERENCE SIGNS LIST 2 light-emitting diode
4 light-emitting element
6 substrate for electronic components
8, 10 patterned electrode
12 through hole electrode
14 pass-through hole
16 mounting board
18 patterned electrode
20 solder fillet
21 solder 22 base
24 wiring plate
26 electrode portion
28 mounting board
30 heat sink
32 mounting board
34 light-emitting diode
36 pass-through hole
38 peripheral side surface that defines the pass-through hole
40 patterned electrode
40a connecting portion that is patterned electrode extended on the peripheral side surface of the pass-through hole
40b patterned electrode located on the upper surface of the mounting board
40c patterned electrode located on the lower surface of the mounting board
42 base
44 wiring plate
46 substrate for electronic components
48 wire bonding portion
50 light-emitting element
52 sealing resin
54 patterned electrode
54a connecting portions
56 penetrating groove
58 electrode wiring pattern
60 connection portion (solder fillet)
66 pass-through hole
68 small pass-through hole
70, 80 punched hole
72 peripheral side surface that defines the pass-through hole
74 patterned electrode

The invention claimed is:

1. A mounting board comprising:
at least one pair of mounting board patterned electrodes;
a mounting board upper surface;
a mounting board lower surface that is opposed to the mounting board upper surface and the mounting board lower surface contacting a substrate upper surface, the substrate upper surface configured to have an electrical component mounted thereon;
at least one pass-through hole penetrating through the mounting board upper surface and the mounting board lower surface; and
a peripheral side surface that defines each of the at least one pass through hole,
wherein the at least one pair of mounting board patterned electrodes is partly positioned inside the peripheral side surface that defines the pass-through hole,
wherein at least one connection portion, connecting the at least one pair of mounting board patterned electrodes and at least one pair of substrate patterned electrodes provided on the substrate upper surface of the electronic component, is to be disposed inside the peripheral side surface that defines the at least one pass-through hole in which the at least one connection portion is visible when viewed in plan view from the upper surface of the mounting board, and
wherein the mounting board peripheral side surface surrounds an area configured to have the electronic component mounted thereon.

2. The mounting board according to claim 1, wherein the at least one pair of mounting board patterned electrodes each extend from the mounting board upper surface to the mounting board lower surface across the peripheral side surface that defines the at least one pass-through hole.

3. The mounting board according to claim 1, wherein the at least one pair of mounting board patterned electrodes include a plurality of mounting board patterned electrodes, each being provided independently along the at least one pass-through hole and each extending from the mounting board upper surface to the mounting board lower surface across the peripheral side surface that defines the at least one pass-through hole.

4. The mounting board according to claim 1, wherein the at least one pass-through hole includes a plurality of penetrating grooves that are cut into the mounting board from the peripheral side surface that defines the pass-through hole and that penetrate through the mounting board upper and lower surfaces, and the plurality of penetrating grooves electrically split the at least one pair of mounting board patterned electrodes.

5. The mounting board according to claim 1, wherein the at least one pass-through hole comprises a combination of a plurality of independent small pass-through holes smaller than the at least one pass-through hole provided in the mounting board and a punched hole punched at a position adjacent to the small pass-through holes and linking the plurality of small pass-through holes, and wherein the at least one pair of mounting board patterned electrodes extend from the mounting board upper surface to the mounting board lower surface across the peripheral side surface that defines the plurality of small pass-through holes.

6. The mounting board according to claim 1, wherein the at least one pair of mounting board patterned electrodes each extend from the mounting board upper surface to the mounting board lower surface across the peripheral side surface that defines the at least one pass-through hole, and the at least one pair of mounting board patterned electrodes are, at the mounting board lower surface, to be in contact with the at least one pair of substrate patterned electrodes disposed on the substrate upper surface.

7. The mounting board according to claim 1,
wherein the at least one connection portion connects the at least one pair of mounting board patterned electrodes to a connecting portion of the at least one pair of substrate patterned electrodes disposed on the substrate upper surface,
wherein the connecting portion that extends on the substrate upper surface over the peripheral side surface that defines the at least one pass-through hole toward an inside of the at least one pass-through hole and a connecting portion of at least one pair of mounting board patterned electrodes that are partly disposed on the peripheral side surface that defines the at least one pass-through hole are connected by soldering.

8. The mounting board according to claim 4, wherein the penetrating grooves radially extend into the peripheral side surface that defines the at least one pass-through hole.

9. The mounting board according to claim 8, wherein the at least one pair of patterned electrodes are formed radially along the at least one pass-through hole between the plurality of penetrating grooves.

10. The mounting board according to claim 1, wherein the electronic component is a light-emitting diode.

11. The mounting board according to claim 1, further comprising an electrode wiring pattern extending on a surface of the mounting board radially from each of the at least one pair of mounting board patterned electrodes, centering around the at least one pass-through hole.

12. A mounting structure of a mounting board, comprising an electronic component including:
a substrate that includes a base made from metal, and a wiring plate disposed on an upper surface of the base and including at least one pair of patterned electrodes on the wiring plate, and at least one semiconductor element electrically connected to the at least one pair of patterned electrodes of the wiring plate; and
a mounting board that includes at least one pair of mounting board patterned electrodes, a mounting board upper surface, a mounting board lower surface that is opposed to the mounting board upper surface, the mounting board lower surface contacting a substrate upper surface, the substrate upper surface configured to have electronic component mounted thereon, at least one pass-through hole penetrating through the mounting board upper surface and the mounting board lower surface, and a peripheral side surface that defines the at least one pass-through hole;
wherein the at least one pair of mounting board patterned electrodes is partly positioned inside the peripheral side surface that defines the at least one pass-through hole, and
wherein at least one connection portion, connecting the at least one pair of mounting board patterned electrodes and the at least one pair of wiring plate patterned electrodes of the electronic component, is disposed inside the peripheral side surface that defines the at least one pass-through hole.

13. The mounting structure of a mounting board according to claim 12, wherein the at least one pair of mounting board patterned electrodes include a plurality of patterned electrodes, each of the patterned electrodes is provided independently along the at least one pass-through hole, and each of the patterned electrodes extends from the mounting board upper surface to the mounting board lower surface across the peripheral side surface that defines the at least one pass-through hole.

14. The mounting structure of a mounting board according to claim 12, wherein at the connection portion, the at least one pair of substrate patterned electrodes are disposed on the substrate upper surface and extend over the at least one peripheral side surface that defines the at least one pass-through hole of the mounting board inwardly of the at least one pass-through hole and the at least one pair of mounting board patterned electrodes are connected by solder at the at least one connection portion adjacent to the peripheral side surface that defines the at least one pass-through hole.

15. The mounting structure of a mounting board according to claim 12, wherein the semiconductor element is a light-emitting element.

16. The mounting structure of a mounting board according to claim 12, wherein the at least one connection portion is positioned within the at least one pass-through hole, and is visually seen when viewed from above the upper surface of the mounting board.

17. The mounting structure according to claim 12, wherein the at least one pass-through hole includes a plurality of penetrating grooves that are cut into the mounting board from the peripheral side surface defining the at least one pass-through hole and that penetrate through the mounting board upper and lower surfaces, and the plurality of penetrating grooves electrically split the at least one pair of mounting board patterned electrodes.

18. The mounting structure according to claim 12,
wherein the at least one pass-through hole comprises a combination of a plurality of independent small pass-through holes smaller than the at least one pass-through hole provided on the mounting board and a punched hole punched at a position adjacent to the small pass-through holes and linking the plurality of small pass-through holes, and
wherein the at least one pair of mounting board patterned electrodes extend from the mounting board upper surface to the mounting board lower surface across at least one peripheral side surface that defines the plurality of small pass-through holes.

19. An electronic appliance comprising:
a mounting board comprising a mounting board upper surface, a mounting board lower surface that is opposed to the mounting board upper surface, at least one peripheral side surface that defines at least one pass-through hole penetrating through the mounting board upper and lower surfaces, and at least one pair of mounting board patterned electrodes partly positioned inside the at least one peripheral side surface;
an electronic component comprising a substrate that comprises at least one pair of substrate patterned electrodes arranged on a substrate upper surface, the substrate upper surface mounted onto the mounting board lower surface, and the at least one pair of substrate patterned electrodes partly positioned within the at least one pass-through hole of the mounting board; and
at least one connection portion electrically connecting the at least one pair of mounting board patterned electrodes and the at least one pair of substrate patterned electrodes, the at least one connection portion being positioned and visible within the at least one pass-through hole of the mounting board when viewed in plan view from the upper surface of the mounting board.

20. The electronic appliance according to claim 19, wherein the electronic component comprises a light-emitting element.

21. The electronic appliance according to claim 19, wherein a plurality of penetrating grooves that are cut into the mounting board from the at least one peripheral side surface electrically split the at least one pair of patterned electrodes.

* * * * *